US009907208B2

(12) United States Patent
Bose et al.

(10) Patent No.: US 9,907,208 B2
(45) Date of Patent: Feb. 27, 2018

(54) HOLD DOWN FOR RETAINING A HEAT SINK

(71) Applicant: THOMSON LICENSING, Issy de Moulineaux (FR)

(72) Inventors: William Hofmann Bose, Nashville, IN (US); Mickey Jay Hunt, Camby, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 14/356,909

(22) PCT Filed: Nov. 21, 2012

(86) PCT No.: PCT/US2012/066175
§ 371 (c)(1),
(2) Date: May 8, 2014

(87) PCT Pub. No.: WO2013/078260
PCT Pub. Date: May 30, 2013

(65) Prior Publication Data
US 2014/0321064 A1 Oct. 30, 2014

Related U.S. Application Data

(63) Continuation of application No. PCT/US2012/046466, filed on Jul. 12, 2012.
(Continued)

(51) Int. Cl.
H05K 7/20 (2006.01)
H01L 23/40 (2006.01)
(Continued)

(52) U.S. Cl.
CPC .......... *H05K 7/2039* (2013.01); *F16M 13/02* (2013.01); *H01L 23/4093* (2013.01); *H05K 3/30* (2013.01);
(Continued)

(58) Field of Classification Search
CPC .................................................. H05K 7/2039
See application file for complete search history.

(56) References Cited

U.S. PATENT DOCUMENTS 4,679,118 A * 7/1987 Johnson .............. H01L 23/4093
174/16.3
5,208,731 A * 5/1993 Blomquist .......... H01L 23/4093
174/16.3
(Continued)

FOREIGN PATENT DOCUMENTS

CN 1826046 A 8/2006
CN 101072486 A 11/2007
(Continued)

OTHER PUBLICATIONS

International Search Report dated May 2, 2013.

*Primary Examiner* — David M Sinclair
*Assistant Examiner* — Robert Brown
(74) *Attorney, Agent, or Firm* — Tutunjian & Bitetto, P.C.

(57) ABSTRACT

At least one implementation provides a hold down for an electronic device. The electronic device includes a support frame, a circuit board coupled to the support frame and having at least one component, a thermal pad thermally coupled to the component, and a heat sink associated with the thermal pad. The hold down includes a generally planar portion adapted to be positioned over a surface of the heat sink. The hold down also includes a plurality of connecting structures extending angularly from the generally planar portion. The connecting structures and configured to engage the support frame to cause the hold down to apply the
(Continued)

biasing force to retain the thermal pad against at least one of the heat sink or the component when the heat sink and the thermal pad are positioned between the hold down and the support frame. A method is also provided for attaching the hold down.

19 Claims, 13 Drawing Sheets

Related U.S. Application Data

(60) Provisional application No. 61/562,127, filed on Nov. 21, 2011.

(51) Int. Cl.
  *F16M 13/02* (2006.01)
  *H05K 3/30* (2006.01)

(52) U.S. Cl.
  CPC .... *H05K 7/2049* (2013.01); *H01L 2924/0002* (2013.01); *Y10T 29/4913* (2015.01)

(56) References Cited

U.S. PATENT DOCUMENTS

| | | | | |
|---|---|---|---|---|
| 5,371,652 | A | 12/1994 | Clemens et al. | |
| 5,436,798 | A * | 7/1995 | Wieland, Jr. | H01L 23/4093 165/185 |
| 5,464,054 | A * | 11/1995 | Hinshaw | H01L 23/4093 165/185 |
| 5,570,271 | A | 10/1996 | Lavochkin | |
| 5,594,624 | A * | 1/1997 | Clemens | H01L 23/4093 174/16.3 |
| 5,602,719 | A * | 2/1997 | Kinion | H01L 23/4093 165/185 |
| 5,933,326 | A * | 8/1999 | Lee | H01L 23/4093 165/80.3 |
| 6,108,207 | A * | 8/2000 | Lee | H01L 23/4093 165/80.2 |
| 6,118,659 | A * | 9/2000 | Adams | H01L 23/3677 174/16.3 |
| 6,223,815 | B1 | 5/2001 | Shibasaki | |
| 6,229,705 | B1 * | 5/2001 | Lee | H01L 23/4093 165/80.3 |
| 6,295,203 | B1 * | 9/2001 | Lo | H01L 23/4093 24/457 |
| 6,452,800 | B2 * | 9/2002 | Lee | H01L 23/4093 24/458 |
| 6,477,048 | B2 * | 11/2002 | Huang | H01L 23/4093 165/80.3 |
| 6,500,024 | B2 * | 12/2002 | Hsu | H01L 23/4093 257/E23.086 |
| 6,826,052 | B2 * | 11/2004 | Ma | H01L 23/4093 165/80.3 |
| 7,265,984 | B2 | 9/2007 | Numata | |
| 7,336,492 | B2 * | 2/2008 | Yu | H01L 23/4093 165/104.33 |
| 7,564,687 | B2 * | 7/2009 | Liu | H01L 23/4093 165/185 |
| 7,924,567 | B2 * | 4/2011 | Zha | H01L 23/4093 165/185 |
| 8,620,162 | B2 * | 12/2013 | Mittleman | H04M 1/0202 340/815.42 |
| 2001/0004313 | A1 | 6/2001 | Yamaoka | |
| 2005/0036290 | A1 * | 2/2005 | Yang | G06F 1/1613 361/704 |
| 2005/0088826 | A1 | 4/2005 | Throum | |
| 2006/0187643 | A1 * | 8/2006 | Tsurufusa | H05K 7/2049 361/704 |
| 2006/0187645 | A1 * | 8/2006 | Numata | H05K 7/2049 361/704 |
| 2007/0177356 | A1 * | 8/2007 | Panek | G06F 1/20 361/712 |
| 2007/0263363 | A1 | 11/2007 | Liu et al. | |
| 2010/0097768 | A1 * | 4/2010 | Ishii | H01L 23/4006 361/719 |
| 2011/0255850 | A1 * | 10/2011 | Dinh | G03B 15/03 396/176 |
| 2013/0347051 | A1 * | 12/2013 | Bose | H04N 21/418 725/151 |

FOREIGN PATENT DOCUMENTS

| | | |
|---|---|---|
| JP | 7183679 | 7/1995 |
| JP | 2000269671 | 9/2000 |
| JP | 200115964 | 1/2001 |
| JP | 2001160608 | 6/2001 |
| JP | 2001168562 | 6/2001 |
| JP | 2004186294 | 7/2004 |
| JP | P2005533714 | 11/2005 |
| JP | 2006237149 | 9/2006 |
| JP | 2010103256 | 5/2010 |
| WO | WO2010118971 | 10/2010 |

* cited by examiner

HOLD DOWN FOR RETAINING A HEAT SINK

CROSS REFERENCE TO RELATED APPLICATIONS

This application claims the benefit, under 35 U.S.C. § 365 of International Application PCT/US2012/066175, filed Nov. 21, 2012, which was published in accordance with PCT Article 21(2) on May 30, 2013 in English and which claims the benefit of U.S. provisional patent application No. 61/562,127, filed Nov. 21, 2011 and International Application PCT/US2012/046466 filed Jul. 12, 2012.

TECHNICAL FIELD

One or more implementations relate to a set top box, and more particularly, a set top box having a hold down for retaining a heat sink.

BACKGROUND

Thermal management remains a significant challenge in set top boxes. With the introduction of more components such as smart card readers and increased functionalities, which tend to produce more heat, the need for an improved thermal management system exists.

An additional complication in set top boxes is the need to reduce the size of set top boxes due to consumer preference. This trend for compactness also makes thermal management a challenge, because this greater compactness with an increase in the number of internal components generally results in a concentration of heat.

Proper thermal contact between a thermal pad on a circuit board and a heat sink improves heat dissipation from the circuit board. Existing means for securing the heat sink against the thermal pad result in undesirable rattling of the heat sink against the thermal pad and set top box. Additionally, existing securing means do not provide sufficient contact of the thermal pad with the heat sink.

Therefore, a need exists for a retainer to secure a heat sink in proper contact with the thermal pad and stabilize the heat sink to reducing rattling.

SUMMARY

According to a general aspect, a hold down is provided for an electronic device. The electronic device includes a support frame, a circuit board coupled to the support frame and having at least one component, a thermal pad thermally coupled to the component, and a heat sink associated with the thermal pad. The hold down includes a generally planar portion adapted to be positioned over a surface of the heat sink. The hold down also includes a plurality of connecting structures extending angularly from the generally planar portion. The connecting structures are configured to engage the support frame to cause the hold down to apply a biasing force against the heat sink to retain the thermal pad against at least one of the heat sink or the component when the heat sink and the thermal pad are positioned between the hold down and the support frame.

According to another general aspect, an electronic device includes a support frame, a circuit board coupled to the support frame and having at least one component, a thermal pad thermally coupled to the component, a heat sink associated with the thermal pad, and a hold down. The hold down is for providing a biasing force against the heat sink. The hold down includes a generally planar portion adapted to be positioned over a surface of the heat sink. The hold down also includes a plurality of connecting structures extending angularly from the generally planar portion. The connecting structures are configured to engage the support frame to cause the hold down to apply the biasing force against the heat sink to retain the thermal pad against at least one of the heat sink or the component when the heat sink and the thermal pad are positioned between the hold down and the support frame.

According to another general aspect, a hold down for an electronic device is accessed. The electronic device includes a support frame, a circuit board coupled to the support frame and having at least one component, a thermal pad thermally coupled to the component, and a heat sink associated with the thermal pad. The hold down includes a generally planar portion adapted to be positioned over a surface of the heat sink. The hold down also includes a plurality of connecting structures extending angularly from the generally planar portion and configured to engage the support frame to cause the hold down to apply the biasing force against the heat sink to retain the thermal pad against at least one of the heat sink or the component when the heat sink and the thermal pad are positioned between the hold down and the support frame. A first of the connecting structures is attached to a first mating location on the support frame. A second of the connecting structures is attached to a second mating location on the support frame. The generally planar portion is configured to engage with the first and second mating locations to cause the hold down to apply the biasing force.

The details of one or more implementations are set forth in the accompanying drawings and the description below. Even if described in one particular manner, it should be clear that implementations may be configured or embodied in various manners. Other aspects and features will become apparent from the following detailed description considered in conjunction with the accompanying drawings and the claims.

BRIEF DESCRIPTION OF THE DRAWINGS

A more detailed understanding of various implementations may be had from the following description, in conjunction with the accompanying drawings, wherein.

DETAILED DESCRIPTION

Figure 1:
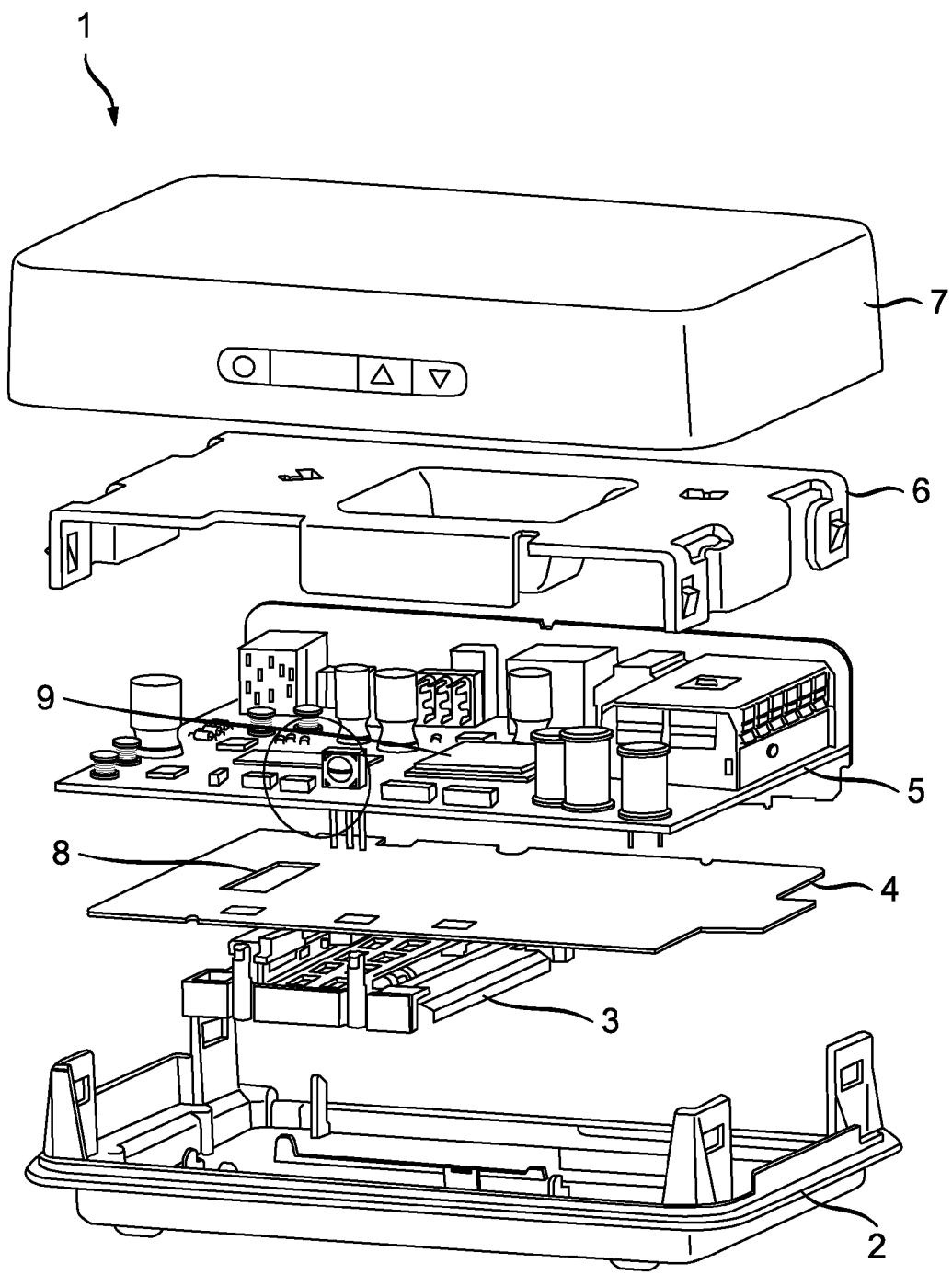
FIG. 1 is an exploded view of a set top box according to the prior art.

A variety of implementations are described. At least one implementation includes a hold down for a heat sink, and the hold down includes wires. At least a second implementation includes a hold down for a heat sink, and the hold down includes a sheet metal structure. The figures of this application generally relate to at least both of these implementations. However, FIGS. 1-9 generally relate more particularly to the implementation that includes wires in the hold down, and FIGS. 10-24 generally relate more particularly to the implementation that includes sheet metal in the hold down.

In at least one implementation, a hold down for an electronic device is provided that urges a heat sink against a circuit board. The heat sink snaps into a bottom frame. The hold down includes a frame having retainers that match and engage slots in the bottom frame and the heat sink. The hold down provides a biasing force that urges the heat sink against the circuit board.

At least one embodiment provides a hold down for a set top box or the like that includes a bottom frame, a circuit board mounted above the bottom frame, a thermal pad mounted on the circuit board, and a heat sink associated with the thermal pad. The hold down can include a frame that defines a perimeter having a plurality of retainers that are configured to engage with a plurality of mating locations defined on at least a bottom frame to provide a biasing force that retains the heat sink against a circuit board that is positioned between the bottom frame and the hold down. The heat sink can include a planar portion surrounding a central depression portion and/or another depression portion. The hold down secures the thermal pad of the circuit board between the central depression portion and/or other portion of the heat sink and the circuit board. The hold down can include a plurality of wires that cross each other, which can be over or in the central depression. The plurality of wires can be dimensioned such that the biasing force is applied across a top surface of the heat sink.

The plurality of wires can include central portions that extend downwards along an inner surface of the central depression portion of the heat sink. The heat sink can include grooves in the planar portion for receiving the wires. The heat sink can include a second central depression portion that contacts a second heat generating component on the circuit board. The bottom frame can include vertically extending portions on opposing sides having slots and the heat sink can include vertical extensions having clips that snap into the slots of the bottom frame, thereby securing the heat sink to the bottom frame. The retainers can include U-shaped or V-shaped contours that are received in the mating locations of the bottom frame and the heat sink. The retainers can include a first vertical portion, a lower horizontal portion, and second vertical portion that is received in the mating locations of the bottom frame and the heat sink.

At least one embodiment is directed to an electronic device. The electronic device includes a bottom frame, a circuit board mounted above the bottom frame, a thermal pad mounted on the circuit board, a heat sink associated with the thermal pad, and a hold down for providing a biasing force that retains the heat sink against the thermal pad. The hold down can comprise a frame that defines a perimeter having a plurality of retainers that are configured to engage with a plurality of mating locations defined on at least the bottom frame. The heat sink can include a planar portion surrounding a central depression portion and the hold down secures the thermal pad of the circuit board between the central depression portion of the heat sink and the circuit board. The hold down includes a plurality of wires that cross each other. The plurality of wires can be dimensioned such that the biasing force is applied across a top surface of the heat sink. The plurality of wires can include central portions that extend downwards along an inner surface of the central depression portion of the heat sink. The heat sink includes grooves in the planar portion for receiving the wires. The grooves can have a V or U profile to provide space for the hold down such that the hold down has no portion that is higher than the planar portion.

At least one implementation constructs the hold down using a sheet metal structure that is generally planar and rectangular on the top. The rectangular surface has a long dimension and a short dimension. Along the long dimension, the two ends are bent in the same direction at substantially a 90 degree angle from the rectangular surface. The rectangular surface is placed in contact with the heat sink, and the two ends come down past the heat sink and connect to a bottom structure so as to secure the hold down over the heat sink. The rectangular surface is bowed so that downward pressure is used to align the two ends with the mating surfaces on the bottom structure. This results in the hold down applying continuous downward pressure on the heat sink. The pressure provides improved thermal conductivity between the heat sink the heat source, and reduces movement and rattling among the components secured between the hold down and the bottom structure.

As illustrated in FIG. 1, a circuit board 5 is housed within a top cover 7 of a set top box 1. A thermal barrier 4 is positioned between the circuit board 5 and a bottom frame 2. A smart card reader 3 is connected to the circuit board 5 through an aperture 8 in the thermal barrier 4. The set top box 1 has internal components including the smart card reader 3, the thermal barrier 4, the circuit board 5, and a heat sink 6 that contacts the circuit board 5 and is positioned between the bottom frame 2 and the top cover 7. The thermal barrier 4 includes a thermal insulating material that preferably has substantially the same profile as the circuit board 5, although other profiles are envisioned. For example, various implementations have a profile that is at least 80% of the area profile of the circuit board 5. The thermal barrier 4 keeps the smart card reader 3 and other components under the circuit board 5 from overheating, in part, by preventing heat from transferring from the circuit board 5 and the components thereon.

The heat sink 6 is a heat dissipating feature that removes heat from the circuit board 5. The heat sink 6 has a top plan profile that covers all or part of the circuit board 5. Various implementations of the heat sink 6 have a top plan profile that (i) completely covers the circuit board 5, (ii) substantially covers the circuit board 5, (iii) covers at least 80% of the circuit board 5, or (iv) covers less than 80% of the circuit board 5.

The heat sink 6 may include a thermal pad 9. In various implementations, the thermal pad 9 is (i) formed in a unitary structure with the heat sink 9, (ii) formed in a unitary structure with a component of the circuit board 5, (iii) formed in a unitary structure with both the heat sink 9 and a component of the circuit board 5, or (iv) formed separately from the heat sink 6 and the component of the circuit board 5. A "unitary" structure refers to a structure that is not designed to be separated. For example, a molded product forms a unitary structure. Additionally, however, two components that are glued together form a unitary structure. Conversely, two components held together by removable compression or by a removable fastener do not form a unitary structure.

Common implementations of a thermal pad 9 use a compressible silicon pad having a tacky feel. The tacky feel of the pad 9 in these implementations serves to help keep the pad 9 in place. Other implementations use a pad 9 that has tape or glue as part of the pad 9.

The heat sink 6 is a contoured plate that has a generally planar periphery 52 and a recessed feature such as a central depression 53 into a plane of the planar periphery 52, wherein the planar periphery 52 preferably surrounds the central depression 53. The central depression 53 has side walls extending from the planar periphery 52 and forming an obtuse angle therewith. The central depression 53 has a flat bottom that is designed to contact the circuit board 5, the heat generating components on the circuit board 5, and/or the thermal pad 9.

Figure 2:
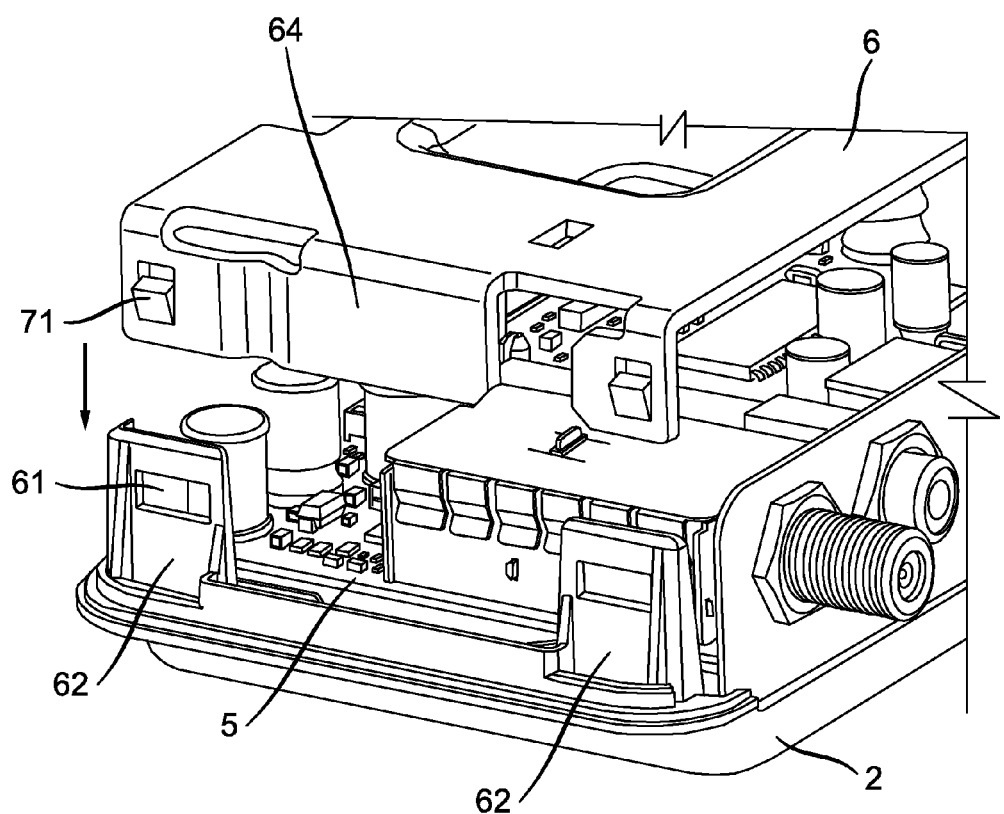
FIG. 2 is an enlarged view showing the heat sink of FIG. 1 prior to attachment with the bottom frame.

The heat sink 6 has vertical extensions 64 at the outer edges of the planar periphery 52 that are perpendicular to the planar periphery 52 and that extend over the circuit board 5 and contact the bottom frame 2 or vertically extending portions 62 of the bottom frame 2. The heat sink 6 attaches to the bottom frame 2 through slots and clips formed on these elements. The vertically extending portions 62 extend from the bottom frame 2 and have receiving slots 61 that are designed to receive clips 71 formed on the vertical extensions 64 of the heat sink 6. The vertically extending portions 62 may be plastic components, and as such, allow the heat sink clips 71 to elastically snap into the slots 61, thereby securing the heat sink 6 to the bottom frame 2. As illustrated in FIG. 2, the arrow indicates how the heat sink clips 71 are pressed downward onto the bottom frame slots 61.

Figure 3:
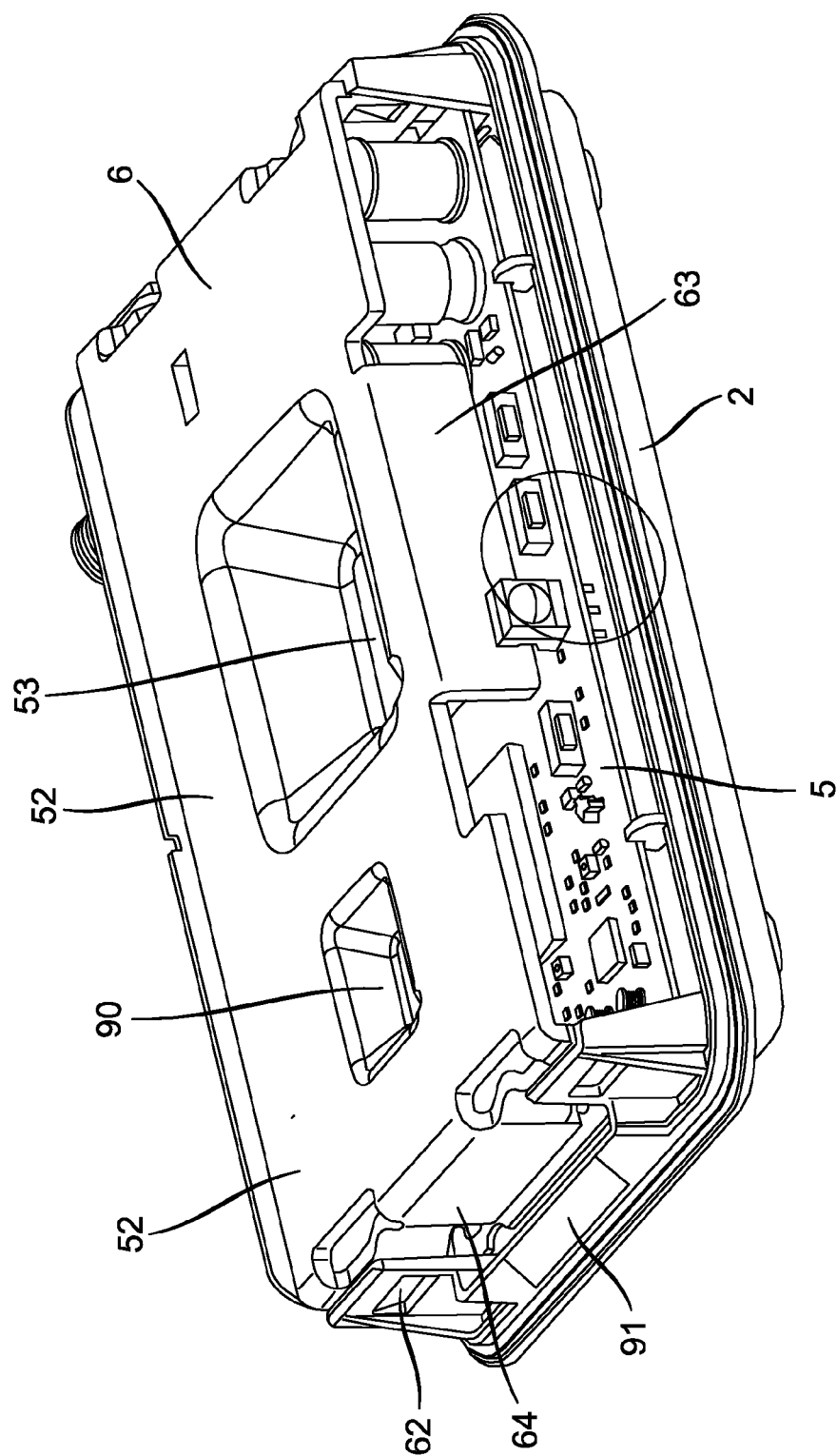
FIG. 3 illustrates the interior components of the set top box of FIGS. 1-2 with the heat sink attached to the bottom frame.

FIG. 3 is a perspective view of interior components of the set top box 1. The heat sink 6 may include a second central depression 90 that contacts a secondary thermal pad 99 associated with the smart card reader 3. The bottom frame 2 may include a smart card access slot 91 below the circuit board 5 and one of the vertical extensions 64 of the heat sink 6. The slot 91 may also be between the vertically extending portions 62 of the bottom frame 2. The second central depression 90 thermally communicates with the smart card reader 3 through an aperture 8 in the circuit board 5 or the secondary thermal pad 99 through the circuit board 5.

Figure 4:
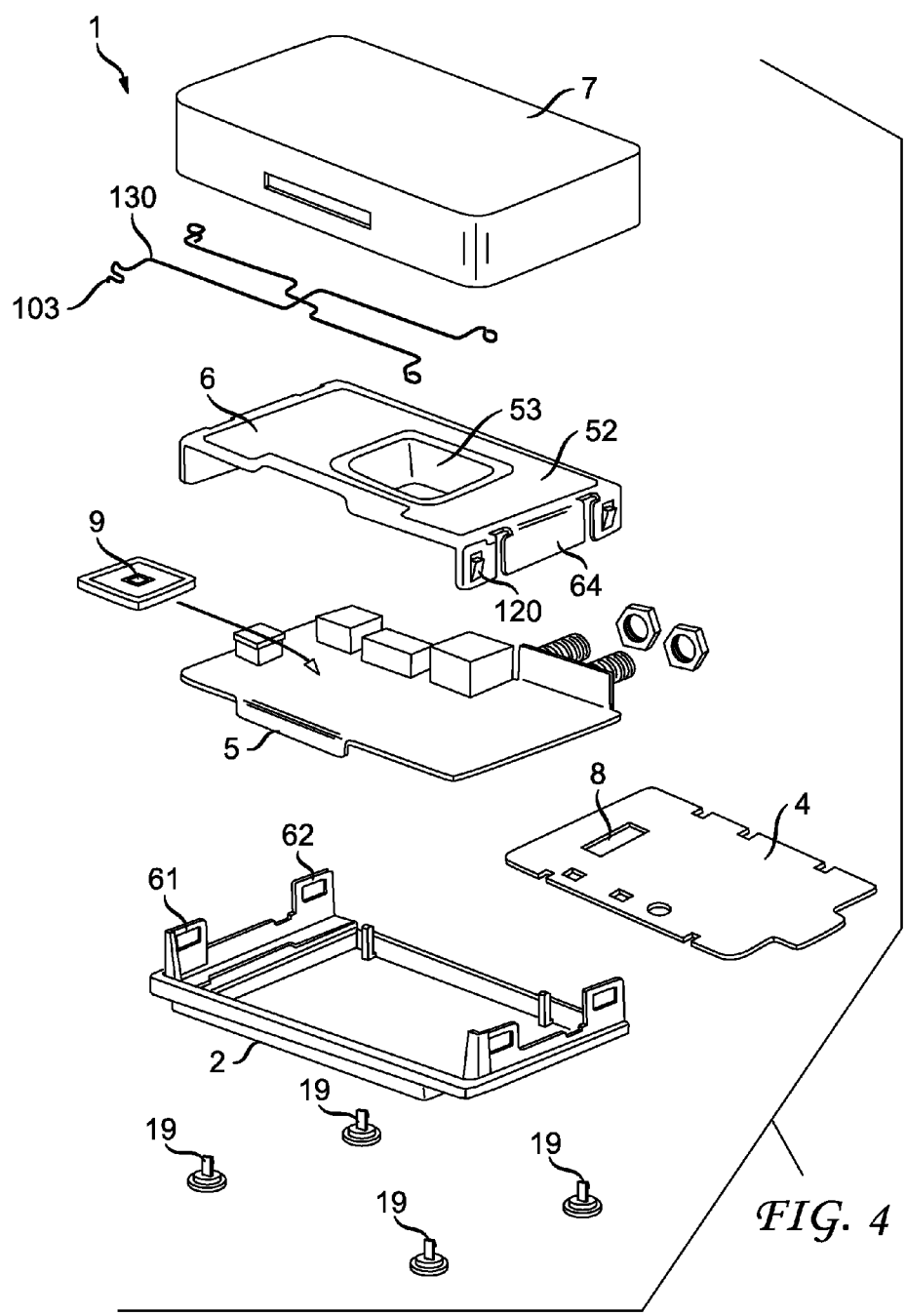
FIG. 4 is an exploded view of the set top box with the hold down.

The set top box 1 described in FIGS. 1-3 further includes a hold down 130 to secure the heat sink 6 against the circuit board 5. FIG. 4 shows an exploded view of the set top box 1 with the hold down 130. The hold down 130 includes a frame that defines a perimeter. The hold down 130 may be a rectangular frame that generally matches the shape of the heat sink 6. The perimeter of the hold down 130 includes retainers 103 arranged at the ends of the hold down 130. The retainers 103 are shaped to match and engage mating locations provided on at least the bottom frame 2. The heat sink 6 may also include mating locations for the retainers 103. The hold down 130 is preferably constructed from a rigid flexible material, such as a wire or multiple wires, preferably 304 stainless steel, that may extend diagonally to bias the heat sink 6 downwards against the thermal pad 9 and to provide contact between the circuit board 5, the thermal pad 9, and the central depression 53 of the heat sink 6 for proper thermal dissipation. The wires may cross each other such that one wire includes a bent portion that extends below the other wire. The region where the hold down components or wires cross can be centralized to be over the central depression and can be inside the central depression. The hold down or wires can be applied to the prior art assemblies to enhance heat transfer to the heat sink.

The bottom surface of the central depression 53 and the circuit board 5 contact the thermal pad 9 on opposite sides and sandwich the thermal pad 9 between them. The hold down 130 improves the surface contact among these components.

The hold down 130 may be formed from a resilient material. The hold down 130 is preferably dimensioned such that the hold down 130 is tensioned when installed and exerts a biasing force across the top of the heat sink 6 or at a specific location on the heat sink 6 after the retainers 103 of the hold down 130 engage the mating locations of the bottom frame 2 and the heat sink 6.

Figure 8:
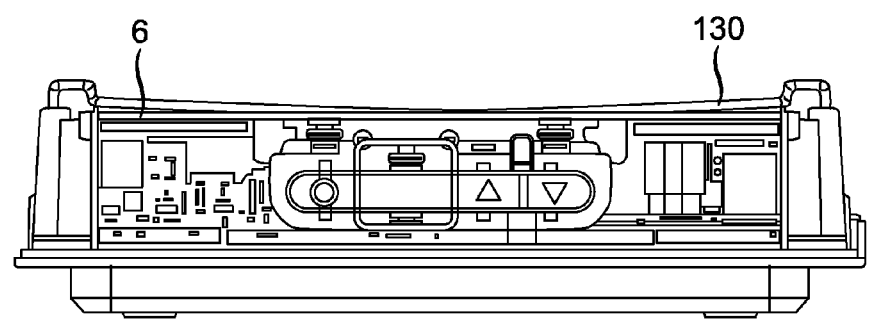
FIG. 8 illustrates the hold down including a bow in the downward direction.

The top surface of the heat sink 6 may define a longitudinal plane and the frame of the hold down 130 may extend in this plane or in a parallel plane. As shown in FIG. 8, when the hold down 130 engages the mating locations of the bottom frame 2 and the heat sink 6 and the hold down 130 engages the top surface of the heat sink 6, the heat sink 6 and the hold down 130 bows in the downward direction away from the initial plane or planes. The hold down 130 may also include end portions that rise vertically above the longitudinal plane of the heat sink 6. The extent of the hold down 130 between the end portions may bow downwardly to apply force to the heat sink 6. The hold down 130 may include a central portion that extends downward into the central depression 53 of the heat sink 6 and along the inner contours of the central depression 53 such that the hold down 130 is in further contact with the heat sink 6 and movement is further reduced. As compared to existing set top boxes, the hold down 130 allows for a thinner thermal pad 9 to be used because of the biasing force from the hold down 130 on the heat sink 6.

The thinner thermal pad 9 is possible in various implementations for at least the reason that the additional biasing force provides less of a gap between the heat sink 6 and the thermal pad 9. The thermal pad 9 is typically made of a pliable and compressible material. With a smaller expected gap, the thermal pad 9 need not be as thick because there is less space to fill with the thermal pad 9.

Figure 5:
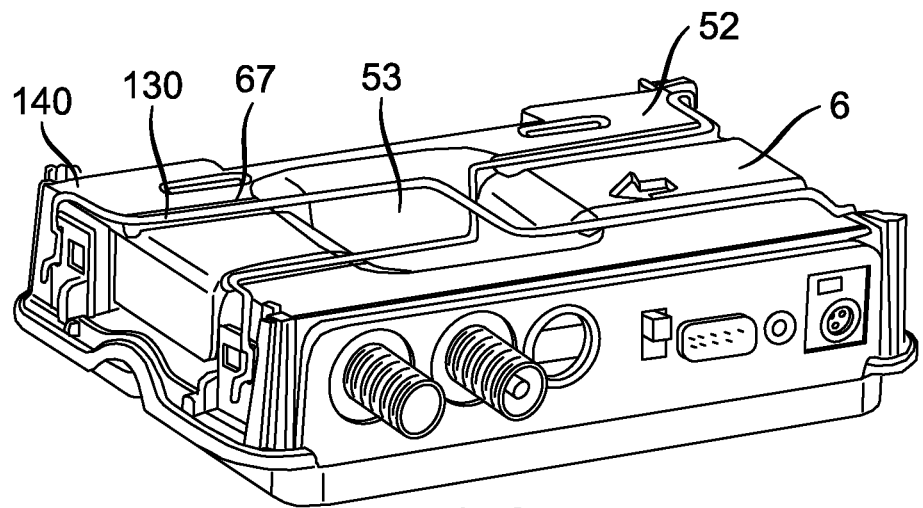
FIG. 5 illustrates grooves in the heat sink for engaging the hold down.

FIGS. 5-8 show various features of the set top box 1 and the hold down 130. The retainers 103 of the hold down 130 engage slots 92 formed on the vertically extending portions 62 of the bottom frame 2 and slots 120 formed on the vertical extensions 64 of the heat sink 6. FIG. 5 shows an assembled cutaway view of the set top box 1 with the hold down 130 pressing the central depression 53 of the heat sink 6 downward onto the thermal pad 9 on the circuit board 5. The heat sink 6 may include grooves 67 that are sufficiently deep to receive the hold down 130 and prevent the hold down 130 from protruding above the heat sink 6. The grooves 67 allow the vertical height of the set top box 1 to remain the same as compared to set top boxes without a hold down. The vertical extensions 64 of the heat sink 6 may also include cutout portions 140 that are shaped to receive portions of the hold down 130.

Figure 6:
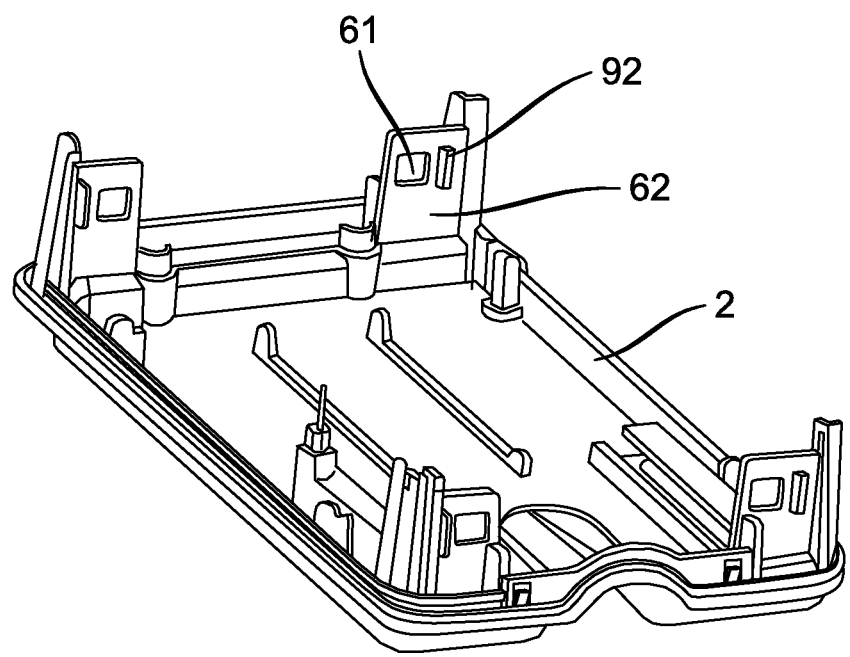
FIG. 6 illustrates the slots of the bottom cover.
Figure 7:
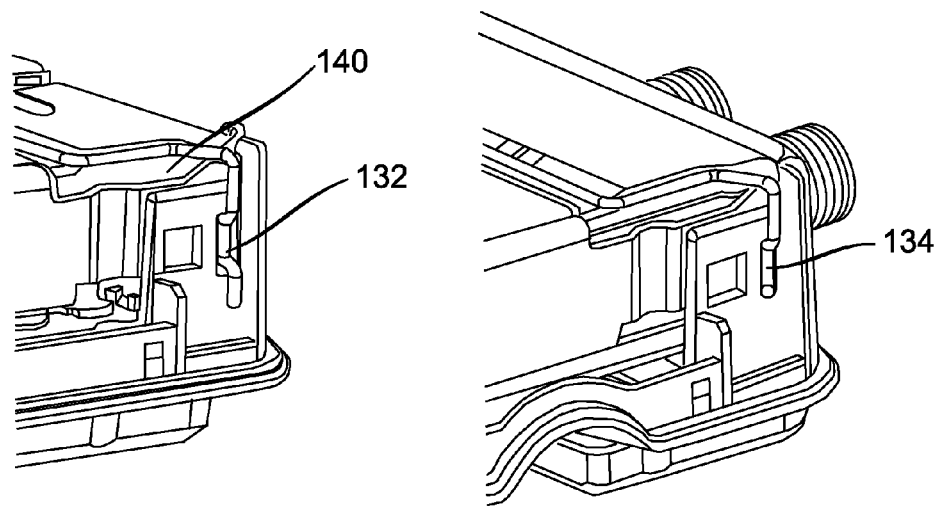
FIG. 7 illustrates alternative retainers of the hold down.

FIG. 6 illustrates the slots 61 on the bottom frame 2 for receiving the clips 71 of the heat sink 6, and the slots 92 for receiving the retainers 103 at the ends of the hold down 130. FIG. 7 shows alternative embodiments of the retainers 103 of the hold down 130 and illustrates the retainers 103 may include any suitable end which secures the hold down 130 with the mating locations of the bottom frame 2 and the heat sink 6. The retainers 103 may include ends 132 with U-shaped or V-shaped inward contours that engage the slots 92 of the bottom frame 2 and the slots 120 of the heat sink 6. The retainers 103 may alternatively include ends 134 with a first vertical portion, a lower horizontal portion, and second vertical portion which engage the slots 92, 120 of the bottom frame 2 and heat sink 6. As noted above, the ends 132, 134 may engage the slots 92, 120 in such a way to tension the hold down 130.

As discussed earlier, in set top boxes with broad top heat sinks, thermal contact between the heat sink and the thermal pads can often be poor and the broad top heat sinks can exhibit rattling. One implementation for addressing this is to provide a sheet metal hold down. The sheet metal hold down can often provide better securing for the top broad heat sink, so that the heat sink does not rattle and makes better thermal contact with the thermal pad(s). Compared to a hold down made of wires, the sheet metal hold down is often easier to handle and less likely to twist than the wire-formed hold down. However, the wire-formed hold down is advantageous in various regards as well.

Figure 9:
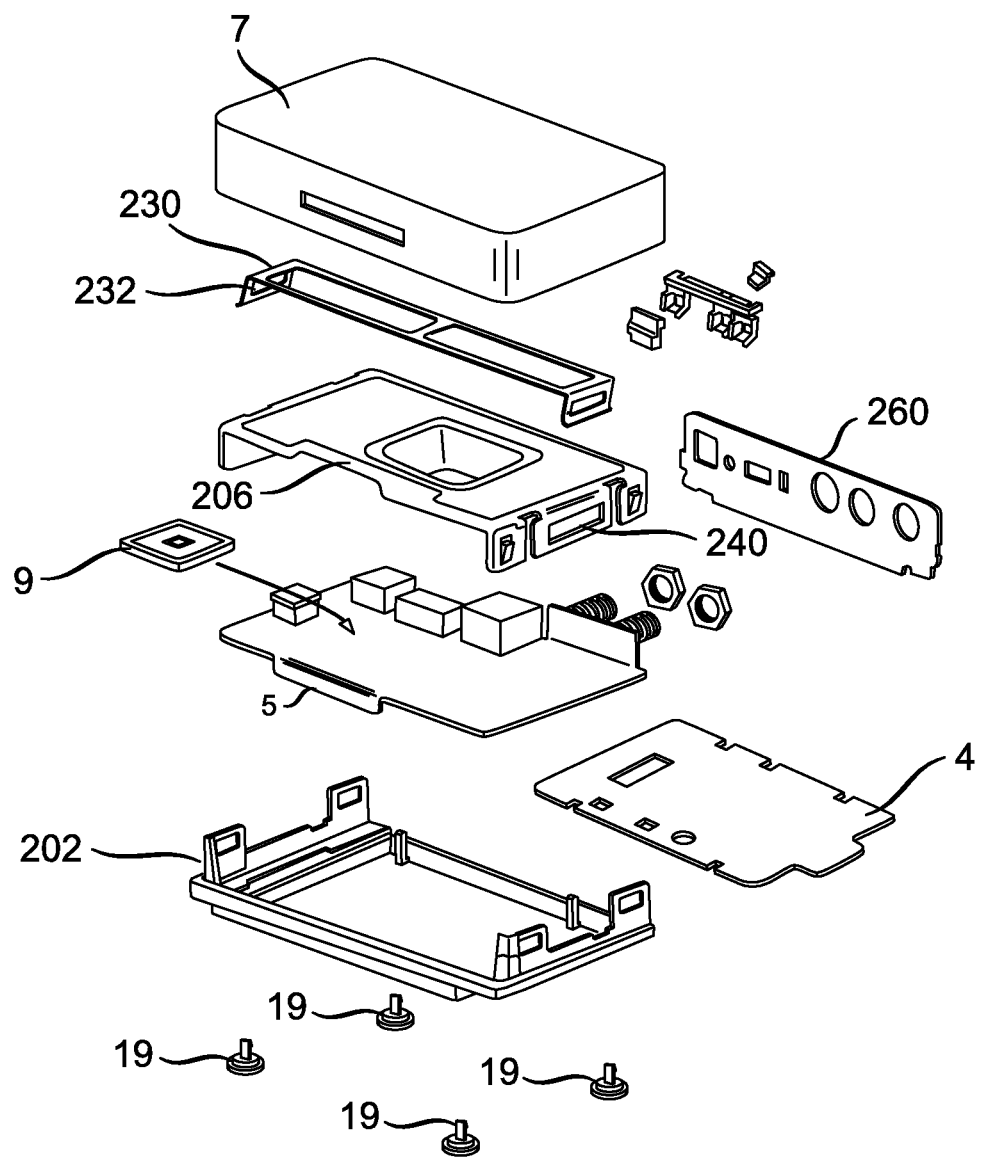
FIG. 9 is an exploded view of a set top box having a hold down.

FIG. 9 is similar in many respects to FIG. 1, and common elements will generally not be explained again. FIG. 9 is a disassembled view of the set top box showing how key components can be positioned with respect to one another, wherein the thermal insulator 4 is positioned between a bottom cover 202 and the printed circuit board assembly (pcb) 5.

Additionally, a thermal pad 9 is positioned between the printed circuit board assembly 5 and a main heat sink 206. The main heat sink 206 has the central depression 53 that contacts the thermal pad 9, which in turn contacts and draws heat from heat generating components in the pcb 5. The main heat sink 206 further has a planar peripheral portion surrounding the central depression 53 and also can have at least one set of opposing sides perpendicular to the planar peripheral portion at the outer edges of the planar peripheral portion that extend over the pcb 5 and can contact the bottom cover 202 or vertically extending portions of the bottom cover 202. The vertically extending portions of the bottom cover 202 or a bottom frame component can help to secure the main heat sink 206.

This is done by having at least one aperture 232 in a hold down 230, the aperture 232 used to receive clips 250 that protrude the vertical side walls of the main heat sink (that is, opposing sides) 206. The bottom cover 202 or frame component further has a side wall portion that can have the end hooks 250 on them which can go through clearance holes or slots 240 in the heat sink. The end hooks 250 will engage the apertures 232 of the hold down component 230, as explained further below.

The heat sink hold down component 230 (which can be sheet metal) applies a downward force on the heat sink 206 to not only help secure the heat sink 206, but also to ensure that the central depression 53 adequately contacts the thermal pad 9. Here, the heat sink 206 is shown not having any grooves for receiving the hold down component, but may optionally have a groove so as not to increase the vertical height requirement of the set top box. The hold down component 230 functions to reduce rattling, and to increase thermal contact.

The receiving aperture 232 of the hold down 230 can receive an end hook, a tab, or other protrusion from, for example, the bottom cover 202. The end hooks 250 of the bottom cover 202 can be in the form of hooks, tabs, or other protrusions. The end hooks 250 are configured to go through the aperture 232 of the hold down 230, and to go through the aperture 240 of the heat sink 206. The aperture 240 in the heat sink 206 can be, for example, a hole that is surrounded on all sides by material of the heat sink. In such configurations, the end hooks 250 are designed, for example, so that the heat sink 206 can snap over the end hooks 250. This occurs, in various different implementations, for example, by having the heat sink 206 be flexible and/or by having the end hooks 250 be flexible.

Some alternate implementations use a cutout that has no material from the heat sink 206 along one side of the cutout. For example, a "U" shaped cutout allows the heat sink 206 to slide down on top of the end hooks 250 of the bottom cover 202, without surrounding the end hooks 250, and therefore without needing to be snapped over the end hooks 250 or otherwise installed over the end hooks 250.

FIG. 9 further includes a rear panel 260. The rear panel 260 includes, for example, a power button.

As can be seen from the description above, the embodiment of FIG. 1 differs from the embodiment of FIG. 9 principally in three components: the hold down 230, the heat sink 206, and the bottom cover 202. The principal changes, as described above, are that (i) the hold down 230 is of a different configuration than the hold down 130 because the wires are replaced with a component formed from sheet metal, (ii) the heat sink 206 is modified from the heat sink 6 to accommodate the hold down 230 instead of the hold down 130 (for example, apertures 240 are used rather than, for example, slots 120), and (iii) the bottom cover 202 is modified from the bottom cover 2 to accommodate the hold down 230 instead of the hold down 130 (for example, end hooks 250 are used rather than, for example, slots 92).

Figure 10:
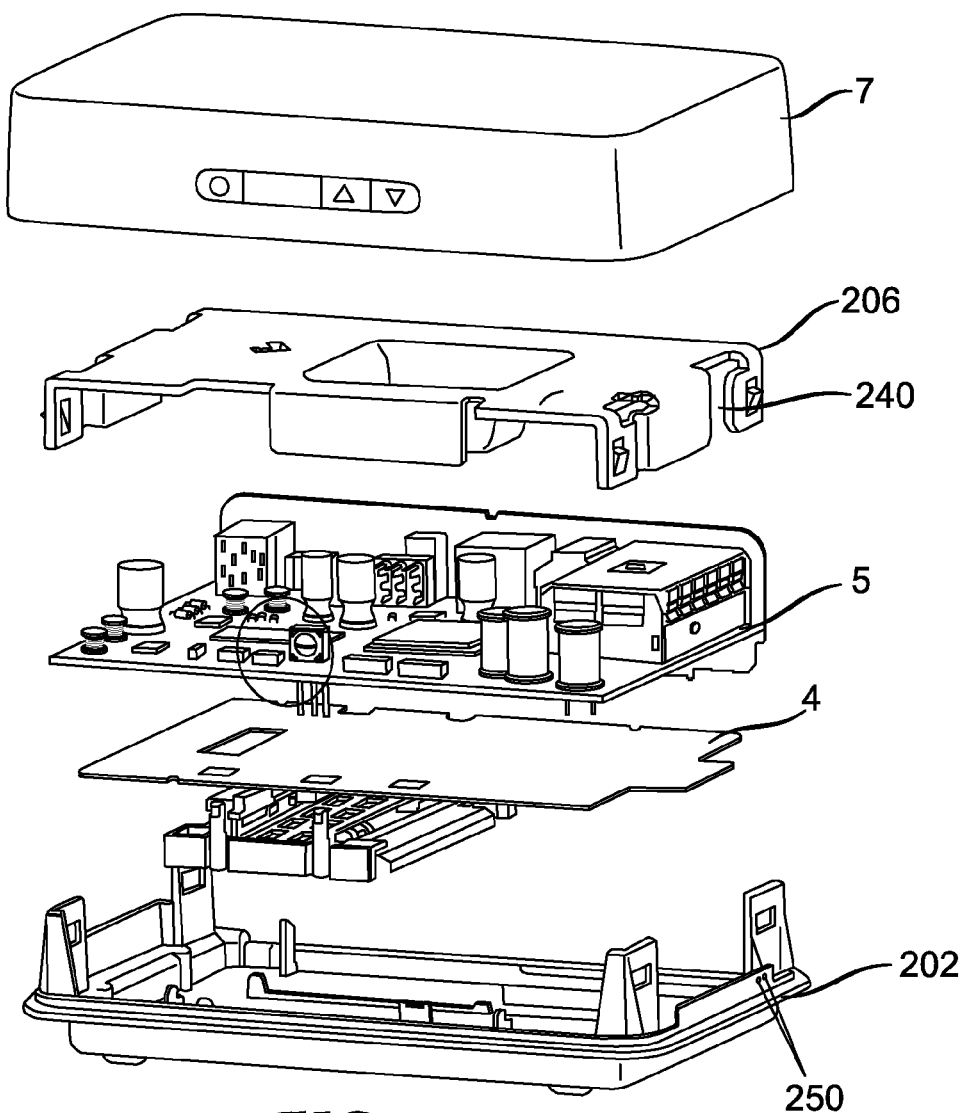
FIG. 10 is an exploded view of a set top box configured for use with a hold down.

FIG. 10 is disassembled view of the set top box showing how key components can be positioned with respect to another, wherein the card reader can be positioned under a thermal insulator (that is, a thermal barrier) 4 and connected to the pcb assembly 5 which is above the thermal insulator 4 through an aperture in the thermal insulator 4. Here, no hold down component is shown. Accordingly, thermal contact is not optimum and some rattling of the heat sink 206 is likely.

The main heat sink 206 is shown as being generally rectangular and having one set of opposing short sides perpendicular to the planar peripheral portion at the outer edges of the planar peripheral portion that are designed to substantially extend over the pcb 5 and to be snapped into the vertically extending portions of the bottom cover 202. FIG. 10 also shows again the end hooks 250 of the bottom cover 202, designed to protrude through the apertures 240 of the heat sink 206.

The main heat sink 206 is shown as also having a long side portion perpendicular to the planar peripheral portion that can extend downward and make additional contact to the pcb 5, at the edge of the pcb 5 opposite the rear panel 260, to further draw heat from the pcb 5.

Figure 11:
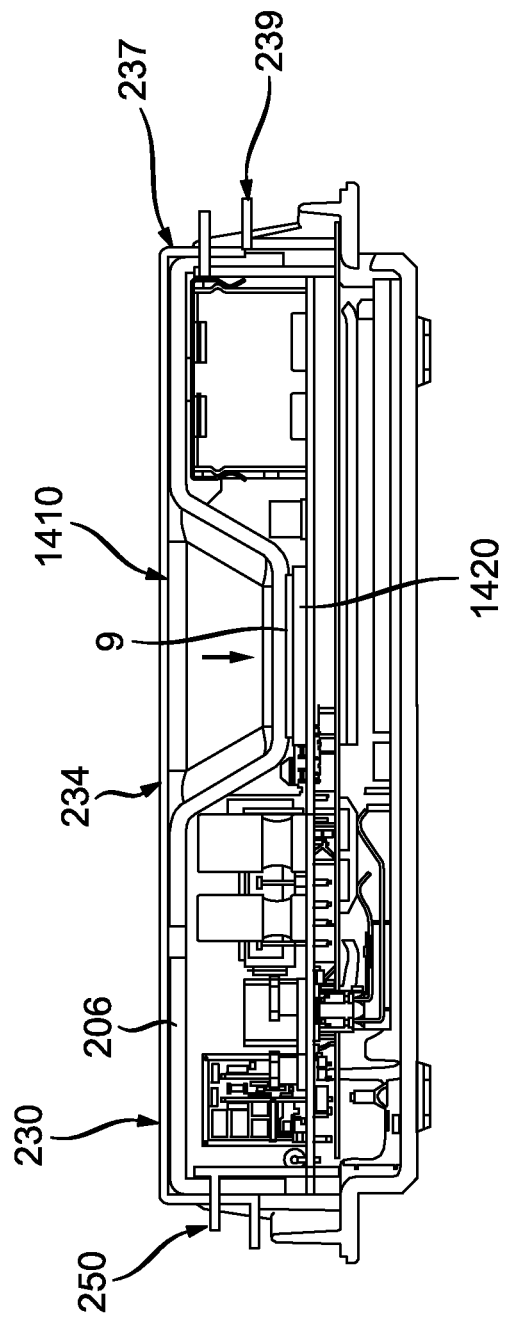
FIG. 11 is a vertical cross-section of a portion of a set top box having a hold down.

FIG. 11 shows a cross section assembled view of the main heat sink 206 over the pcb 5 with the pcb 5 engaged in the bottom cover 202. The drawing shows how the pliable thermal or thermo pad 9 contacts a heat generating part or heat conducting part, such as an IC 1420, of the pcb 5. It further shows how the heat sink 206 contacts the thermo pad 9 through its central depression 53 and shows how the hold down component 230 assists in the contact.

The hold down 230 is shown as a formed sheet metal component with an upper horizontal part 234. The upper horizontal part 234 is formed with a pre-loaded curve that can straighten when fully engaged. The upper horizontal part 234 is a generally planar portion for applying a biasing force against the heat sink 206.

The hold down 230 includes a plurality of connecting structures (one on each end of the upper horizontal part 234) extending angularly from the upper horizontal part 234, in a downward direction in FIG. 11. The connecting structures each include a vertical part 237 extending downward in FIG. 11, and a lower horizontal part 239 extending horizontally from the bottom of the vertical part 237. The vertical part 237 includes the aperture 232. The horizontal part 239 allows gripping and handling of the hold down 230.

The connecting structures are configured to engage with a plurality of mating locations (the end hooks 250) defined on the bottom frame 202, to allow the upper horizontal part 234 to apply the biasing force to retain the heat sink 206 against the thermal pad 9 when the heat sink 206 and the thermal pad 9 are positioned between the hold down 230 and the bottom frame 202.

FIG. 11 shows a downward biasing force 1410 being applied from the upper horizontal part 234 of the hold down 230 to the heat sink 206. The force 1410 is applied by the preloaded curve of the upper horizontal part 234 being straightened out as the hold down 230 is affixed to the bottom support 202.

Note that the hold down 230 and the hold down 130 both provide a biasing force. In most implementations, the biasing force is due, at least in part, to the geometry of the hold down 230 or 130, and the memory and strength of the material from which the hold down 230 or 130 is made. In various implementations, the hold downs 230 and 130 provide a biasing force, at least in part, by operating as a spring. The hold down 230 does provides advantages, over the hold down 130, in certain implementations, because of its ability to easily be stacked for storing or shipping, and its lack of susceptibility to being twisted or bent.

Figure 12:
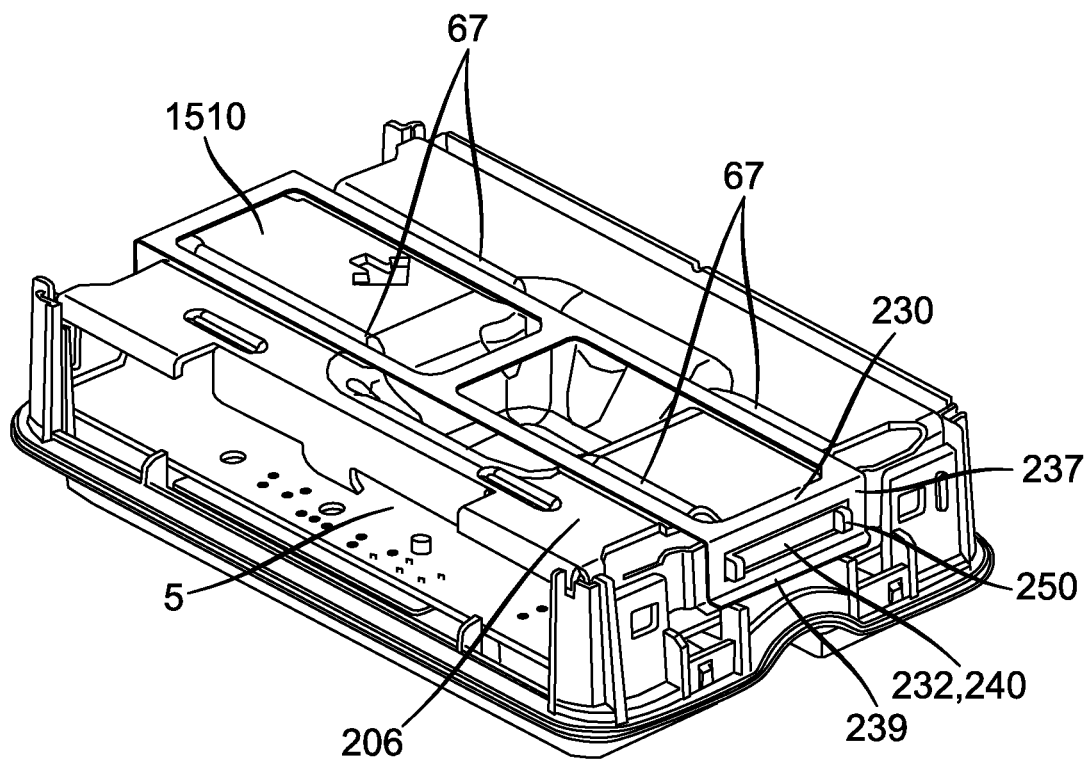
FIG. 12 is a perspective view of an assembled portion of a set top box including a hold down.

FIG. 12 shows a perspective view of the main heat sink 206 in an assembled configuration with the pcb 5 and the bottom cover 202. The hold down component 230 is also shown in this assembled configuration. The heat sink 206 includes grooves 67, as in various implementations of the heat sink 6. The hold down 230 includes two apertures 1510 forming edges of the hold down 230 that are configured to fit within the grooves 67 so that the hold down 230 does not extend vertically above the heat sink 206.

Figure 13:
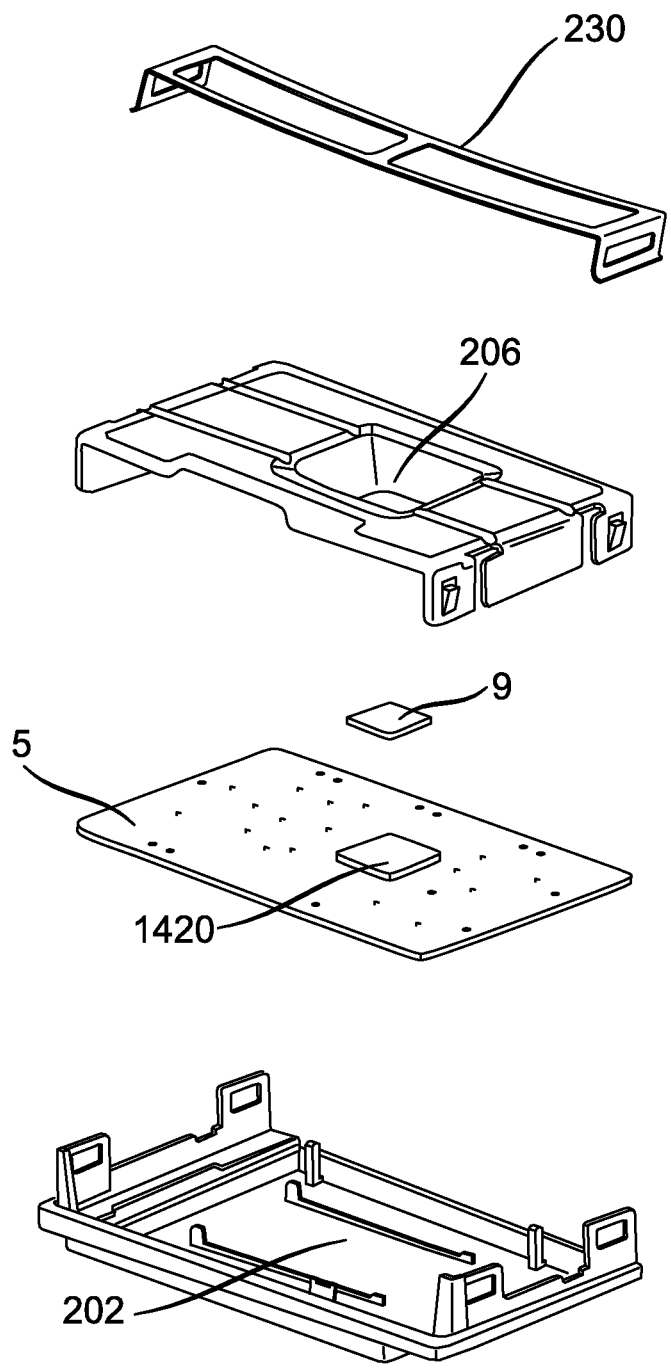
FIG. 13 is an exploded view of select components of a set top box, including a hold down.

FIG. 13 shows an exploded perspective view of the assembly from FIG. 12 in a disassembled configuration. FIG. 13 also shows the thermal pad 9, positioned between, and designed to be in thermal and physical contact with both, the pcb 5 (or the IC 1420 of the pcb 5) and the depression 53 of the heat sink 206.

Various implementations position the thermal pad 9 on top of the main IC 1420 of the pcb 5, as indicated in FIG. 13. Thermal and physical contact of the thermal pad 9 with the pcb 5 is achieved in these implementations by thermal and physical contact of the thermal pad 9 with the main IC of the pcb 5.

Figure 14B:
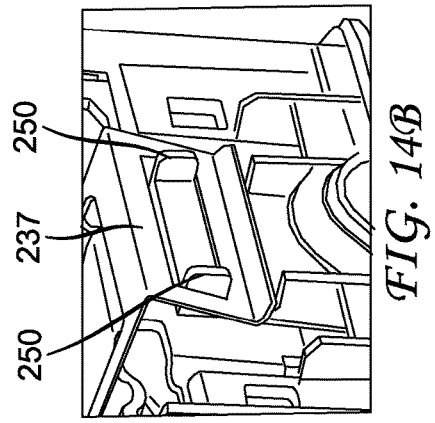
FIG. 14B is an enlarged view of a portion of FIG. 14A.
Figure 14D:
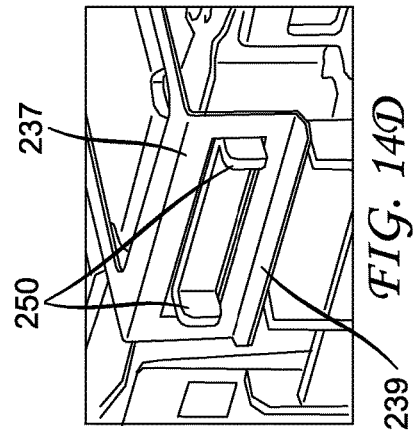
FIG. 14D is an enlarged view of a portion of FIG. 14C.
Figure 14A:
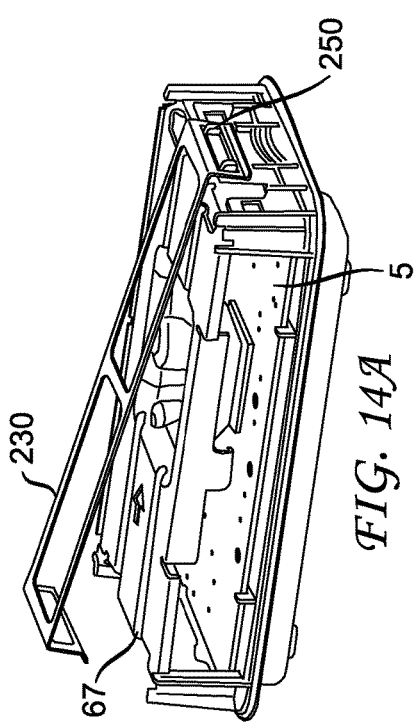
FIG. 14A is a perspective view of a portion of a set top box showing a first step of attaching a hold down.
Figure 14C:
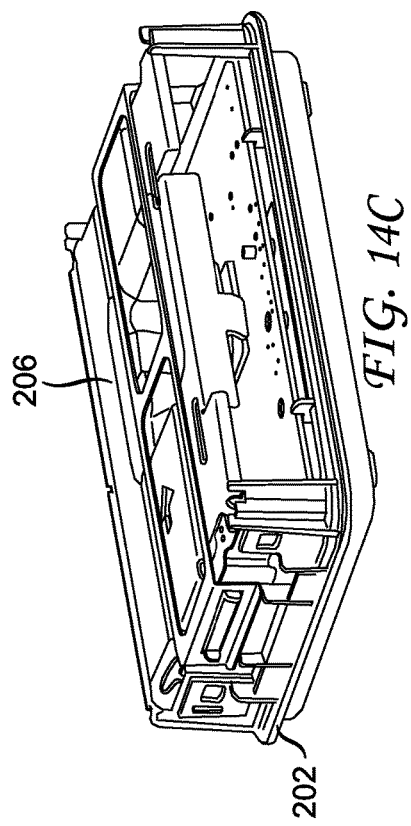
FIG. 14C is a perspective view of a portion of a set top box showing the result after a second step of attaching a hold down.
Figure 15:
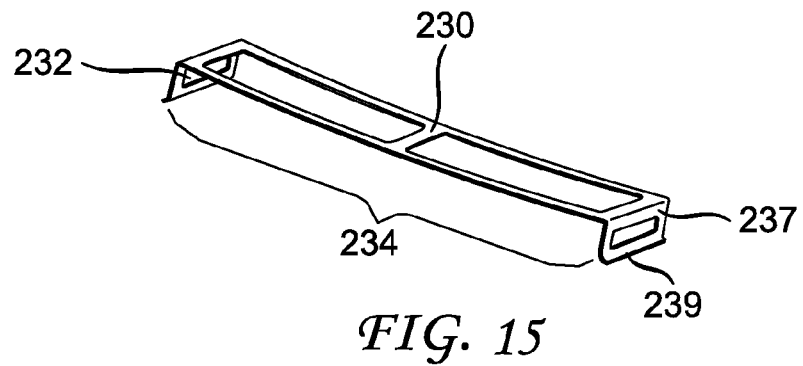
FIG. 15 is a perspective view of a hold down having a preloaded curve.
Figure 16:
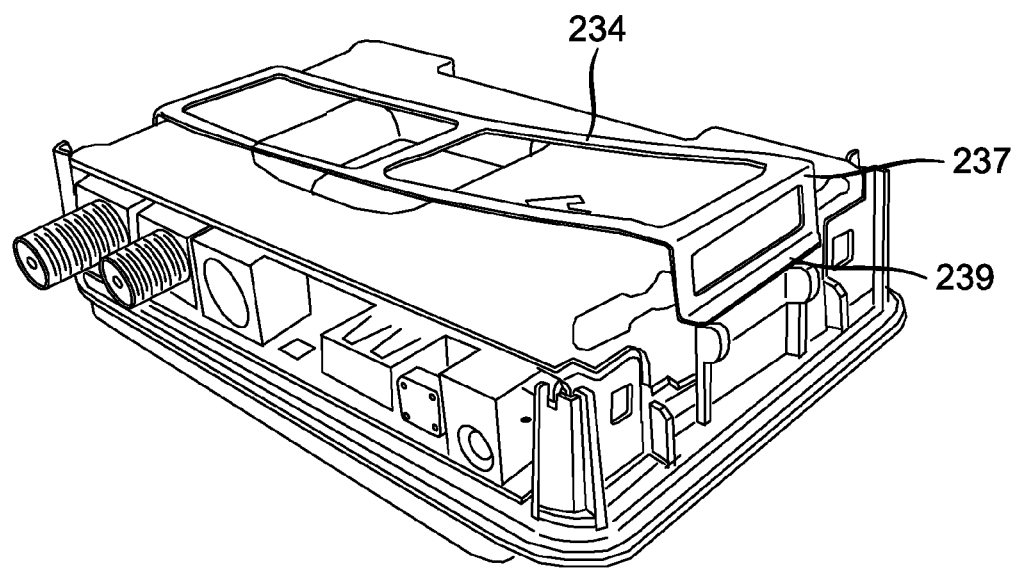
FIG. 16 is a perspective view of an assembled portion of a set top box showing a partially attached hold down.

FIG. 14 includes FIGS. 14A, 14B, 14C, and 14D, and shows four perspective views of the assembly of FIGS. 15 and 16, in various stages of attaching the hold down 230. FIG. 14B is an enlargement of a portion of FIG. 14A, and FIG. 14D is an enlargement of a portion of FIG. 14C.

FIGS. 14A and 14B show a first step in attaching the hold down 230. FIG. 14A shows that the hold down 230 can be attached by first positioning one vertical end 237 of the hold down 230 over a vertical side wall of the bottom cover 202 so that the end hooks 250 go through the end hook receiving aperture 232 of the hold down component 206 (and through the aperture 240 of the heat sink 206). FIG. 14B shows an enlarged view of the attachment of the first vertical end 237 of the hold down 230 to the end hooks 250 of the bottom cover 202.

FIGS. 14C and 14D show a second step in attaching the hold down 230. After attaching the first vertical end 237, then the other vertical end 237 of the hold down component 230 is lowered and its vertical end 237 is flexed outward so that the end hook receiving aperture 232 of the hold down 230 is positioned over the end hooks 250 of the other (corresponding) vertical side wall of the bottom cover 202. This step of attaching the second vertical end 237 is typically achieved by simply pushing down on the hold down 230 near the end of the upper horizontal portion 234 that is adjacent the vertical part 237 that is not yet attached to end hooks 250.

Upon positioning both ends 237 of the hold down 230, the hold down 230 is fully secured to the bottom cover or frame 202. This ensures that the central portion (referred to as the upper horizontal portion 234) of the hold down 230 contacts the top of the heat sink 206 and secures the heat sink 206. As discussed earlier, the central portion 234 can be a preloaded curved portion that has a built-in curve, and that can straighten when fully engaged with the bottom cover or frame 202. The act of securing the second vertical end 237 will involve bending the portion 234 to straighten it out.

The end hooks 250 can exist in pairs on both ends of the device and can be part of the bottom cover 202 or some internal component (for example, an interior frame or the like). In other implementations, the end hooks 250 include only a single hook on each end.

The end hooks 250 can be resilient and flex inward to allow the hold down aperture to fit over the hooks 250, and the hooks 250 can then flex outward to secure the hold down 230 by applying force on the opposing edges (a portion of the vertical end 237) of the end hook receiving aperture 232. The user can flex the hook 250 inward to release and remove the hold down component 250.

Other implementations use non-resilient end hooks 250, requiring the vertical ends 237 of the hold down 230 to flex outward when installing the hold down 230. To remove the hold down 230 in such implementations, the horizontal part 239 can be pulled to extend the vertical part 237 outward past the end hooks 250.

FIG. 15 shows a view of the hold down component 230 in its free state. The "free state" is a state in which there is no external force applied to the hold down 230. FIG. 15 shows how the substanstially horizontal central portion 234 can have a preloaded curve having the convex side facing down and toward the top of the main heat sink 206 (not shown).

FIG. 16 shows the hold down 230 being applied to the heat sink 206, wherein one vertical end is first engaged. As can be seen in FIG. 16, the hold down 230 has a preloaded curve. This is indicated because one end (not shown in FIG. 16) of the hold down 230 is connected to the end hooks 250 of the bottom cover 202, but the other end (visible in FIG. 16) of the hold down 230 is bowed in an upward direction.

FIG. 16 provides an implementation that looks like the heat sink 206 has a cutout rather than an aperture 240. This appearance is due to the fact that there is no heat sink material showing below the end hooks 250. A cutout is indeed used in various implementations, as described earlier.

However, FIG. 16 actually provides an implementation in which the heat sink 206 is configured to fit behind the end hooks 250. Thus, the heat sink 206 of FIG. 16 does not include an aperture 240, or a cutout. Because the heat sink 206 fits behind the end hooks 250, there is no material of the heat sink 206 visible in FIG. 16 beneath the end hooks 250.

The final insertion step occurs after the step shown in FIG. 16, and involves engaging the other vertical end 237 with the corresponding end hooks 250. This final insertion step is typically accomplished by using a finger to apply downward pressure on the unattached end (the end bowed upward in FIG. 16) of the hold down 230 until the second vertical end 237 engages the aperture 232 with the end hooks 250.

Various implementations have been described. In at least one implementation, a set top box is provided that has a horizontal planar thermal insulator. Essentially the horizontal planar thermal insulator divides the interior of the set top box into a top portion (having a printed circuit board assembly) and a bottom portion (having a smart card reader). The horizontal planar thermal insulator is positioned between a bottom cover and the printed circuit board assembly (pcb). A card reader or smart card reader is positioned under the horizontal planar thermal insulator and is thermally insulated from the pcb by the horizontal planar thermal insulator. A thermal pad is positioned between the printed circuit board assembly and a main heat sink. The main heat sink has a central depression that contacts the thermal pad, which in turn contacts and draws heat from the pcb. The main heat sink further has a planar peripheral portion surrounding the central depression. Some additional features can include a thumb access slot on the side of the set top box for removal of a smart card. Further, the main heat sink can have a second depression that makes thermal contact with the smart card reader through the horizontal planar thermal insulator to extract heat from the reader. Additionally, a hold down component is provided which is extends over the heat sink and exerts a downward force on the heat sink to secure the heat sink such that the heat sink make sufficient thermal contact with the thermal pad or pads. The hold down component can be generally flat having an upper horizontal part (preloaded curve), two opposing flexible vertical parts extending down from the upper horizontal part and two lower horizontal parts extending outward from the bottom parts of the vertical parts (which can be used to improve handling).

Various implementations of a hold down are described in this application. A hold down is a retention mechanism and includes any structure able to apply a force to retain, for example, two or more components in contact with each other.

We have thus provided a number of implementations. Additionally, features and aspects of described implementations may be adapted for other implementations. It should also be noted that variations of the described implementations, as well as additional applications, are contemplated and are considered to be within our disclosure. Several variations are described below:

For example, in other implementations the bottom support 202 has apertures in place of the end hooks 250, and the hold down 230 has tabs in place of the apertures 232. The hold down 230 of such implementations secures to the bottom support 202 by mating the tabs of the hold down 230 through the apertures 240 of the heat sink and the apertures of the bottom support. Analogous implementations are also contemplated using the bottom support 2 and hold down 130.

For example, in other implementations the heat sink 206 is below the pcb 5, the hold down 230 is below the heat sink 206, and the hold down 230 connects to the top cover 7. In various such implementations, the pcb 5 is either upside down or has IC components on the bottom, such that the optimum thermal dissipation is achieved by putting the heat sink under the pcb 5 (between the pcb 5 and the bottom cover 202. In various other implementations, there is a top heat sink above the pcb 5, and a bottom heat sink below the pcb 5, and two hold downs are used. A first hold down is above the top heat sink, and a second hold down is below the bottom heat sink.

The term "coupled" is intended to include connections that are either direct connections or indirect connections. Additionally, the coupling can be, for example, electrical coupling, physical coupling, or thermal coupling.

The term "support frame" or "support cover" is used to refer to a frame or cover that provides support. Examples include the bottom cover 202, the bottom cover 2, and the top cover 7. In other implementations, a support frame is neither at the top or bottom, but is located somewhere in the middle of a device.

Reference to "one embodiment" or "an embodiment" or "one implementation" or "an implementation" of the present principles, as well as other variations thereof, mean that a particular feature, structure, characteristic, and so forth described in connection with the embodiment is included in at least one embodiment of the present principles. Thus, the appearances of the phrase "in one embodiment" or "in an embodiment" or "in one implementation" or "in an implementation", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C" and "at least one of A, B, or C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Implementations of the various processes and features described herein may be embodied in a variety of different equipment or applications. Examples of such equipment include an encoder, a decoder, a post-processor, a pre-processor, a video coder, a video decoder, a video codec, a web server, a television, a set-top box, a router, a gateway, a modem, a laptop, a personal computer, a tablet, a cell phone, a PDA, and other communication devices. As should be clear, the equipment may be mobile and even installed in a mobile vehicle.

A number of implementations have been described. Nevertheless, it will be understood that various modifications may be made. For example, elements of different implementations may be combined, supplemented, modified, or removed to produce other implementations. Additionally, one of ordinary skill will understand that other structures and processes may be substituted for those disclosed and the resulting implementations will perform at least substantially the same function(s), in at least substantially the same way(s), to achieve at least substantially the same result(s) as the implementations disclosed. Accordingly, these and other implementations are contemplated by this application.

The foregoing illustrates only some of the possibilities for practicing the concepts taught in this application. Many other embodiments are possible within the scope and spirit of this application. It is, therefore, intended that the foregoing description be regarded as illustrative rather than limiting, and that the scope of this application is given by the appended claims together with their full range of equivalents.

The invention claimed is:

1. A hold down for a heat sink in an electronic device that includes a circuit board having at least one component, a support frame coupled to the circuit board, and a thermal pad thermally coupled to the component, the heat sink being associated with the thermal pad, wherein the hold down comprises:
  a portion adapted to be positioned over a surface of the heat sink, said portion comprising a plurality of wires that extend diagonally over the surface of the heatsink and cross each other; and
  a plurality of connecting structures extending from the portion and configured each to engage with the heat sink or the support frame, said plurality of connecting structures being configured to cause the hold down to apply a biasing force against the surface of the heat sink to retain the thermal pad against at least one of the heat sink or the component when the heat sink and the thermal pad are positioned between the hold down and the support frame.

2. The hold down of claim 1, wherein at least one of the connecting structures is configured to engage with a bottom frame of the support frame.

3. The hold down of claim 1, wherein the connecting structures comprise an aperture configured to engage with one or more extensions protruding from the support frame.

4. The hold down of claim 1, wherein:
  the connecting structures extend angularly from ends of the portion; and
  the portion is configured such that, in its free state, the ends of the portion are bowed away from a direction in which the connecting structures extend.

5. The hold down of claim 1, wherein the portion is adapted to be received by at least one groove in the surface of the heat sink.

6. The hold down of claim 1, wherein at least one of the plurality of connecting structures is configured to engage with a plurality of mating locations defined on the support frame to allow the portion to apply the biasing force.

7. The hold down of claim 1, wherein said plurality of wires cross each other in a region being over or inside a central depression portion of said heat sink.

8. The hold down of claim 1, wherein said plurality of wires include central portions that are adapted to extend downwards along an inner surface of a central depression portion of said heat sink.

9. An electronic device comprising:
  a circuit board having at least one component;
  a support frame coupled to the circuit board;
  a thermal pad thermally coupled to the component;
  a heat sink associated with the thermal pad; and
  a hold down for providing a biasing force against the heat sink, wherein the hold down comprises:
    a portion adapted to be positioned over a surface of the heat sink, said portion comprising a plurality of wires that extend diagonally over the surface of the heatsink and cross each other; and
    a plurality of connecting structures extending from the portion and configured each to engage with the heat sink or the support frame, said plurality of connecting structures being configured to cause the hold down to apply the biasing force against the surface of the heat sink to retain the thermal pad against at least one of the heat sink or the component when the heat sink and the thermal pad are positioned between the hold down and the support frame.

10. The electronic device of claim 9, wherein the support frame comprises a bottom frame.

11. The electronic device of claim 9, wherein the connecting structures comprise an aperture configured to engage with one or more extensions protruding from the support frame.

12. The electronic device of claim 9, wherein:
  the connecting structures extend angularly from ends of the portion, and
  the portion is configured such that, in its free state, the ends of the portion are bowed away from a direction in which the connecting structures extend.

13. The electronic device of claim 9, wherein at least one of the plurality of connecting structures is configured to engage with a plurality of mating locations defined on the support frame to allow the portion to apply the biasing force.

14. The electronic device of claim 9, wherein said plurality of wires cross each other in a region being over or inside a central depression portion of said heat sink.

15. The electronic device of claim 9, wherein said plurality of wires include central portions that are adapted to extend downwards along an inner surface of a central depression portion of said heat sink.

16. Heat sink for an electronic device that includes a circuit board having at least one component, a support frame coupled to the circuit board, a thermal pad thermally coupled to the component, and a hold down comprising a plurality of connecting structures, a portion of said hold down adapted to be positioned over a surface of the heat sink said portion comprising a plurality of wires that extend diagonally over the surface of the heat sink and cross each other, wherein said heat sink is associated with the thermal pad and is configured to be engaged with at least one of said plurality of connecting structures of said hold down to cause the hold down to apply a biasing force against the surface of the heat sink to retain the thermal pad against at least one of the heat sink or the component when the heat sink and the thermal pad are positioned between the hold down and the support frame.

17. The heat sink of claim 16, wherein said plurality of wires cross each other in a region being over or inside a central depression portion of said heat sink.

18. The heat sink of claim 16, wherein said plurality of wires include central portions that are adapted to extend downwards along an inner surface of a central depression portion of said heat sink.

19. Support frame for an electronic device that includes a circuit board having at least one component, a thermal pad thermally coupled to the component, a heat sink associated with the thermal pad and a hold down, a portion of said hold down adapted to be positioned over a surface of the heat sink, said portion comprising a plurality of wires that extend diagonally over the surface of the heat sink and cross each other, wherein said support frame is coupled to the circuit board and is configured to be engaged with each of a plurality of connecting structures of said hold down to cause the hold down to apply a biasing force against said surface of the heat sink to retain the thermal pad against at least one of the heat sink or the component when the heat sink and the thermal pad are positioned between the hold down and the support frame.

* * * * *